United States Patent
Liang et al.

(10) Patent No.: US 8,610,248 B2
(45) Date of Patent: Dec. 17, 2013

(54) CAPACITOR STRUCTURE AND METHOD OF MANUFACTURE

(75) Inventors: Qingqing Liang, Beijing (CN); Huicai Zhong, Beijing (CN)

(73) Assignee: Institute of Microelectronics, Chinese Academy of Sciences (CN)

( * ) Notice: Subject to any disclaimer, the term of this patent is extended or adjusted under 35 U.S.C. 154(b) by 375 days.

(21) Appl. No.: 12/993,048

(22) PCT Filed: Sep. 21, 2010

(86) PCT No.: PCT/CN2010/001458
§ 371 (c)(1),
(2), (4) Date: Nov. 16, 2010

(87) PCT Pub. No.: WO2011/097783
PCT Pub. Date: Aug. 18, 2011

(65) Prior Publication Data
US 2011/0233722 A1    Sep. 29, 2011

(30) Foreign Application Priority Data

Feb. 10, 2010  (CN) .......................... 2010 1 0111332

(51) Int. Cl.
*H01L 29/02* (2006.01)
(52) U.S. Cl.
USPC ............. 257/532; 257/E29.002; 257/E21.008
(58) Field of Classification Search
USPC ........................... 257/532, E29.002, E21.008
See application file for complete search history.

(56) References Cited

U.S. PATENT DOCUMENTS

| 4,700,457 A | 10/1987 | Matsukawa |
| 2005/0095851 A1 | 5/2005 | Watanabe et al. |
| 2009/0174031 A1 | 7/2009 | Wang et al. |

FOREIGN PATENT DOCUMENTS

| CN | 1431668 A | 7/2003 |
| CN | 1624894 A | 6/2005 |
| CN | 1773710 A | 5/2006 |
| CN | 1787171 A | 6/2006 |

OTHER PUBLICATIONS

"International Application and Serial No. PCT/CN2010/001458, International Search Report and Written Opnion mailed Dec. 30, 2010", 8 pgs.
"Chinese Application Serial No. 201010111332.9, Office Action mailed Mar. 1, 2012", 8 pgs.

*Primary Examiner* — Mamadou Diallo
(74) *Attorney, Agent, or Firm* — Schwegman Lundberg & Woessner, P.A.

(57) ABSTRACT

The presented application discloses a capacitor structure and a method for manufacturing the same. The capacitor structure comprises a plurality of sub-capacitors formed on a substrate, each of which comprises a top capacitor plate, a bottom capacitor plate and a dielectric layer sandwiched therebetween; and a first capacitor electrode and a second capacitor electrode connecting the plurality of sub-capacitors in parallel, wherein the plurality of sub-capacitors includes a plurality of first sub-capacitors and a plurality of second sub-capacitors stacked in an alternate manner, each of the first sub-capacitors has a bottom capacitor plate overlapping with a top capacitor plate of an underlying second sub-capacitor, with the overlapping plate being a first electrode layer; and each of the second sub-capacitors has a bottom capacitor plate overlapping with a top capacitor plate of an underlying first sub-capacitor, with the overlapping plate being a second electrode layer, the capacitor structure is characterized in that the first electrode layer and the second electrode layers are made of different conductive materials. The capacitor structure has a small footprint on the chip and a large capacitance value, and can be used as an integrated capacitor in an analogous circuit, an RF circuit, an embedded memory, and the like.

9 Claims, 4 Drawing Sheets

CAPACITOR STRUCTURE AND METHOD OF MANUFACTURE

RELATED APPLICATIONS

This application is a nationalization under 35 U.S.C. 371 of PCT/CN2010/001458, filed Sep. 21, 2010 and published as WO 2011/097783 on 18 Aug. 2011, which claimed priority under 35 U.S.C. 119 to Chinese Patent Application Serial No. 201010111332.9, filed Feb. 10, 2010; which applications and publication are incorporated herein by reference in their entirety.

BACKGROUND OF THE INVENTION

1. Field of Invention

The presented application relates to a capacitor structure and a method for manufacturing the same, in particular, to an integrated capacitor structure using in an embedded memory device and a method of manufacture.

2. Description of Prior Art

There is a great demand for an integrated capacitor formed on a substrate in the field such as cellular phones. The integrated capacitor can be used in an analogous circuit and an RF circuit where a capacitance value of above pF is typically required. However, the maximum value of planar capacitance density, which can be achieved in the current integrated circuit process, is about tens of $fF/\mu m^2$. In order to achieve the capacitance value of above pF, the resultant capacitor must have a relatively large footprint on the chip. This decreases an integration level, and causes an undesired parasitic effect due to those wirings having an increased length. Moreover, when used in an embedded memory (such as eDRAM) in a digital circuit, the capacitance value of a memory cell is of critical importance to a retention time of the device. In order to achieve a retention time as long as possible for each memory cell, an integrated capacitor should have a capacitance density as large as possible.

Wang Geng et al. proposed an eDRAM cell having a deep trench capacitor formed in a substrate in U.S. patent application US20090174031A1. Sidewalls of the trench provide most area of a capacitor plate, which reduces a footprint of the eDRAM cell on the surface of the chip, while providing a large capacitance value.

However, the eDRAM cell comprising a deep trench capacitor still has many difficulties in manufacturing process. For example, since a deep trench has a high aspect ratio, a reactive ion etching (RIE) process will take a long time for forming the deep trench, and voids possibly exist in the following metal filling process.

Consequently, the deep trench capacitor has a high manufacturing cost and a poor reliability.

On the other hand, the above difficulties in the manufacturing processes limit the depth of the trench to be formed. The resultant capacitance value is too small to provide a desired retention time of the eDRAM cell.

Yasuo Watanabe et al. proposed a multi-layer ceramic capacitor in U.S. patent application US20050095851A1 which comprises a stack of a dielectric layer paste and an internal electrode paste and includes a sintering step. Although the multi-layer ceramic capacitor structure has a reduced surface area, it is not compatible with a conventional integrated circuit process.

SUMMARY OF THE INVENTION

An object of the present invention is to provide an integrated capacitor structure having a small footprint on a chip and to be manufactured easily.

According to one aspect of the invention, there provides a capacitor structure, comprising, a plurality of sub-capacitors stacked on a substrate, each of which comprises a top capacitor plate, a bottom capacitor plate and a dielectric layer sandwiched therebetween; and a first capacitor electrode and a second capacitor electrode connecting the plurality of sub-capacitors in parallel, wherein the plurality of sub-capacitors include a plurality of first sub-capacitors and a plurality of second sub-capacitors stacked in an alternate manner, each of the first sub-capacitors has a bottom capacitor plate overlapping with a top capacitor plate of an underlying second sub-capacitor, with the overlapping plate being a first electrode layer; and each of the second sub-capacitors has a bottom capacitor plate overlapping with a top capacitor plate of an underlying first sub-capacitors, with the overlapping plate being a second electrode layer, the capacitor structure is characterized in that the first electrode layer and the second electrode layer are made of different conductive materials.

According to another aspect of the invention, there provides a method for manufacturing a capacitor structure, comprising the steps of:

a) forming an insulating layer on a semiconductor substrate;

b) forming repeated stacks of a first electrode layer, a first dielectric layer, a second electrode layer, and a second dielectric layer in an alternate manner on the insulating layer so as to form a multi-layer structure;

c) etching a first side of the multi-layer structure, in which the exposed portion of the second electrode layer at the first side is selectively removed with respect to the first electrode layer, the first dielectric layer, and the second dielectric layer, so that recesses remain at the first side;

d) etching a second side of the multi-layer structure, in which the exposed portion of the first electrode layer at the second side is selectively removed with respect to the first dielectric layer, the second electrode layer, and the second dielectric layer, so that recesses remain at the second side;

e) forming a capping layer of insulating material on the multi-layer structure;

f) forming capacitor openings in the capping layer, which expose the first side and the second side of the multi-layer structure, and in which the insulating material remains in the recesses at the first side and the second side; and g) filling the capacitor openings with a conductive material.

The inventive capacitor structure has a small footprint on the chip and a large capacitance value because a plurality of sub-capacitors are stacked and connected in parallel with each other. Moreover, the capacitor structure may have a desired capacitance value by changing the number of the stacked sub-capacitors. This provides an additional degree of freedom in the design of the capacitor structure.

Preferably, the capacitor structure is provided in shallow trench isolation (STI) so that it does not adversely affect the degree of freedom in the design of active devices.

Moreover, since the first electrode layer and the second electrode layer are made of different materials, the capacitor structure can be formed in etching steps by using masks, which is compatible with the conventional integrated circuit process.

Preferably, the multi-layer structure is mainly formed in Front-End-Of-Line (FEOL), including the steps of depositing dielectric layer and conductive layers, which is compatible with the conventional process, with only some additional masking steps and depositing steps incorporated. More preferably, capacitor openings are formed in Middle-Of-Line (MOL), simultaneously with the formation of contact holes. No additional masking and depositing steps are needed.

DETAILED DESCRIPTION OF PREFERRED EMBODIMENTS

Figure 1:
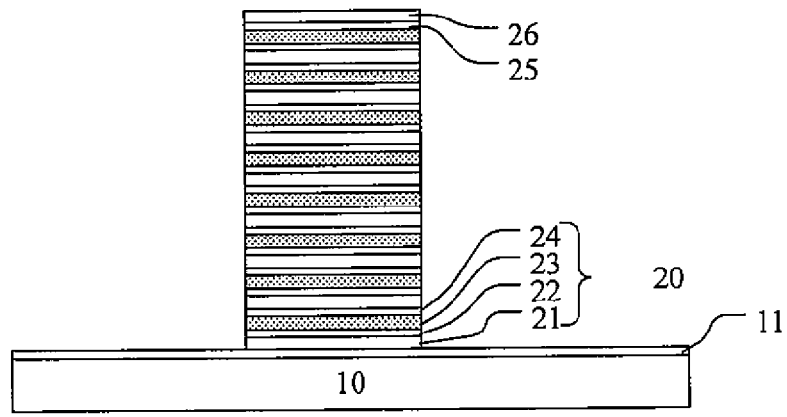
FIGS. 1-8 schematically show cross sectional views of the capacitor structure at various stages of manufacturing process according to the present invention.

Exemplary embodiments of the present invention are described in detail below with reference to the accompanying drawings. In the drawings, like reference numerals denote like members. The figures are not drawn to scale, for the sake of clarity.

It should be understood that when one layer or region is referred to as being "above" or "on" another layer or region in the description of device structure, it can be directly above or on the other layer or region, or other layers or regions may be intervened therebetween. Moreover, if the device in the figures is turned over, the layer or region will be "under" or "below" the other layer or region.

In contrast, when one layer is referred to as being "directly on" or "on and adjacent to" another layer or region, there are not intervening layers or regions present.

Some particular details of the invention will be described, such as an exemplary structure, material, dimension, process step and fabricating method of the device, for a better understanding of the present invention. Nevertheless, it is understood by one skilled person in the art that these details are not always essential for but can be varied in a specific implementation of the invention Typically, the manufacturing process of an integrated circuit can be divided into Front-End-Of-Line (FEOL), from provision of silicon substrate to the step before forming metal silicides used as contacts, such as NiSi, Middle-Of-Line (MOL), from the step of forming metal silicides to the step before forming the first metal wirings, and Back-End-of-Line, including the step of forming the first metal wirings and thereafter.

To illustrate the best compatibility with the conventional manufacturing process of semiconductor device, the following steps are given as being performed in the FEOL and the MOL in the exemplary embodiments. However, it is understood by one skilled person in the art that the manufacturing process of the inventive capacitor structure can be implemented as successive and separate steps by using some specific masks.

The steps shown in FIGS. 1-5 are performed in this order in the FEOL at various stages of manufacturing the capacitor structure, for example, between the step of forming gate spacers and the step of performing extension and halo implantations in a standard CMOS process.

As shown in FIG. 1, a bottom insulating layer 11 is firstly deposited on a substrate 10, and a first electrode layer 21, a first dielectric layer 22, a second electrode layer 23 and a second dielectric layer 24 are then deposited alternately thereon, by a conventional deposition process, such as PVD, CVD, atomic layer deposition, sputtering and the like, so as to form a multi-layer structure comprising repeated stacks 20 of the first electrode layer 21, the first dielectric layer 22, the second electrode layer 23 and the second dielectric layer 24.

Then, silicon dioxide layers 25 and 26 are formed on the top of the multi-layer structure by a further deposition process or a thermal oxidation process, as protection layers for the multi-layer structure and as a hard mask in the following steps.

Then, the multi-layer structure is patterned, for example, to have a stripe shape by an etching process with a photoresist mask.

The following steps may be involved in the pattering process: a photoresist mask having a pattern therein is formed on the multi-layer structure, by a conventional lithographical process including exposure and development steps; the exposed portions of the multi-layer structure are removed by dry etching such as ion beam milling, plasma etching, reactive ion etching, laser ablation and the like; and the photoresist mask is removed by ashing or dissolution with a solvent.

Although not shown in these figures, some portions of a semiconductor device have been formed in the substrate 10, such as source/drain regions, a channel region, a gate dielectric, and a gate conductor, and the like. The bottom insulating layer 11 electrically isolates the capacitor structure to be formed and the substrate 10. Thus, the capacitor structure can be formed anywhere above the substrate 10, i.e. above a metal layer or above an insulating layer.

Areas of the first electrode layer 21 and the second electrode layer 22, materials and thicknesses of the first dielectric layer 22 and the second dielectric layer 24, and the number of the repeated stacks 20 can be determined by the technological level and the desired capacitance value of the capacitor structure. As an example, the stacks 20 of the first electrode layer 21, the first dielectric layer 22, the second electrode layer 23 and the second dielectric layer 24 repeats 100-1000 times, and to each have a thickness of about 20-40 nm.

The first electrode layer 21 and the second electrode layer 23 are both used as capacitor plates and can be a metal layer, a doped polysilicon layer, or a stack of a metal layer and a doped polysilicon layer. The metal layer is made of one selected from a group consisting of TaC, TiN, TaTbN, TaErN, TaYbN, TaSiN, HfSiN, MoSiN, $RuTa_x$, $NiTa_x$, $MoN_x$, TiSiN, TiCN, TaAlC, TiAlN, TaN, $PtSi_x$, $Ni_3Si$, Pt, Ru, Ir, Mo, HfRu, $RuO_x$, and any of their combinations.

As will be mentioned above, the first electrode layer 21 and the second electrode layer 23 should be made of the materials having different etching rate in an etching step. Preferably, the first electrode layer 21 is made of polysilicon, and the second electrode layer 23 is made of TiN.

The first dielectric layer 22 and the second dielectric layer 24 are made of the same or the different dielectric materials, such as oxides, nitrides, oxynitrides, silicates, aluminates, titanates, and the like. The oxides include for example $SiO_2$, $HfO_2$, $ZrO_2$, $Al_2O_3$, $TiO_2$, and $La_2O_3$. The nitrides include for example $Si_3N_4$. The silicates include for example $HfSiO_x$. The aluminates include for example $LaAlO_3$. The titanates include for example $SrTiO_3$. The oxynitrides include for example SiON. Moreover, the dielectric materials can be those developed in the future, besides the above known materials.

Figure 2:
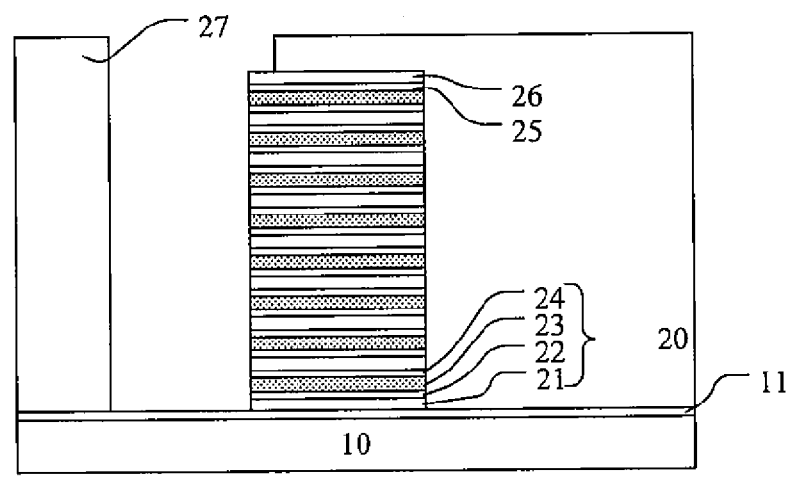

Then, a photoresist mask 27 is formed by a conventional lithographical process, as shown in FIG. 2. The photoresist mask 27 exposes one side (referred as "the first side" hereinafter) of the multi-layer structure, but covers most of the top surface and the other side (referred as "the second side" hereinafter) of the multi-layer structure.

Figure 3:
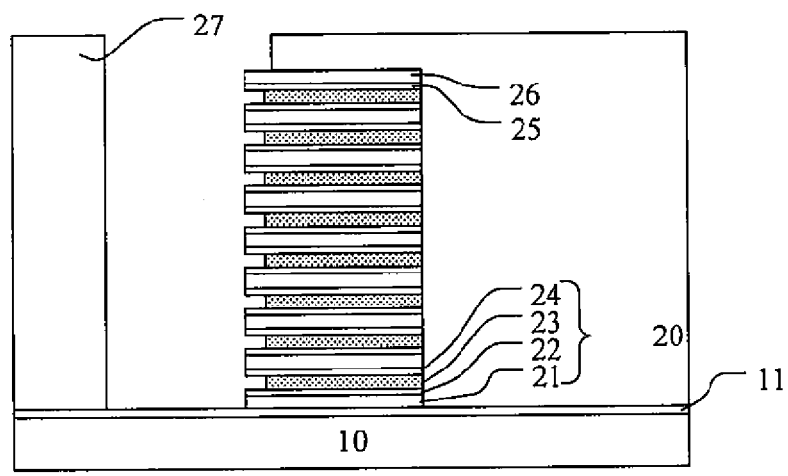

Then, portions of the second electrode layer 23 are selectively removed with respect to the first electrode layer 21, the first dielectric layer 22, and the second dielectric layer 24 by an isotropic etching process, such as conventional wet etching using a solution of etchant, as shown in FIG. 3.

Due to the presence of the photoresist mask 27, only the portions of the second electrode layer 23 at the first side are etched away, and reaches laterally (i.e. from a side wall to an inside of the multi-layer structure) a depth of about 2-10 nm so as to form recesses at the first side of the multi-layer structure.

Then, the photoresist mask is removed by ashing or dissolution with a solvent.

Figure 4:
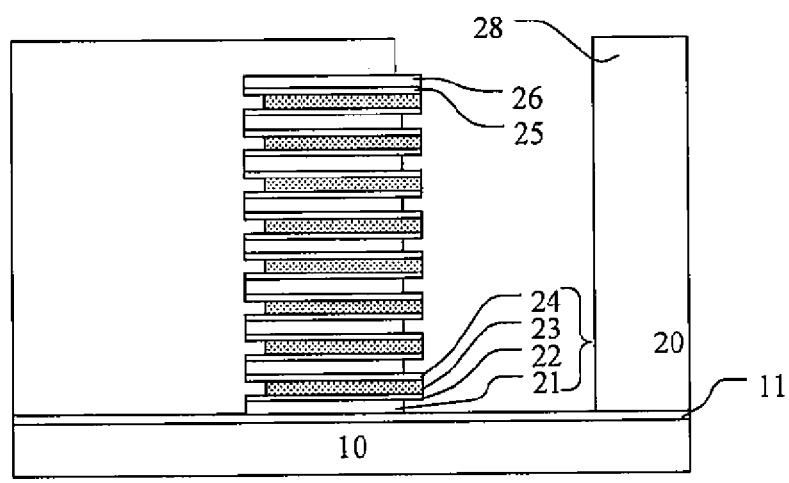

Then, a photoresist mask 28 is formed by a conventional lithographical process, as shown in FIG. 4. The photoresist mask 28 exposes the second side of the multi-layer structure, but covers most of the tope surface and the first side of the multi-layer structure.

Then, portions of the first electrode layer 21 are selectively removed with respect to the first dielectric layer 22, the second electrode layer 23 and the second dielectric layer 24 by an isotropic etching process, such as conventional wet etching using a solution of etchant.

Due to the presence of the photoresist mask 28, only the portions of the first electrode layer 21 at the second side are etched away, and reaches laterally a depth (i.e. from a side wall to an inside of the multi-layer structure) of about 2-10 nm so as to form recesses at the second side of the multi-layer structure.

Then, the photoresist mask is removed by ashing or dissolution with a solvent.

Figure 5:
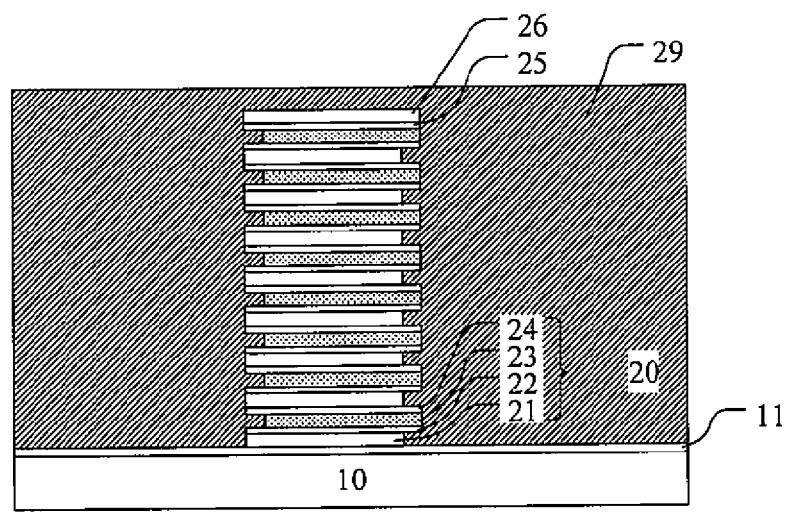

Then, a SiN capping layer 29 is deposited on the multi-layer structure by a conventional deposition process, such as PVD, CVD, atomic layer deposition, sputtering and the like, as shown in FIG. 5. Then, the SiN capping layer 29 is subjected to a chemical mechanical planarization (CMP) so as to provide a flat surface for the multi-layer structure. In the following steps, the SiN capping layer 29 serves as an isolation layer and a protection layer. Also, the SiN capping layer 29 fills the recesses in the first side and the second side of the multi-layer structure.

Then, the manufacturing process continues with standard steps of the CMOS steps, such as source/drain extension implantation and halo implantation.

Figure 6:
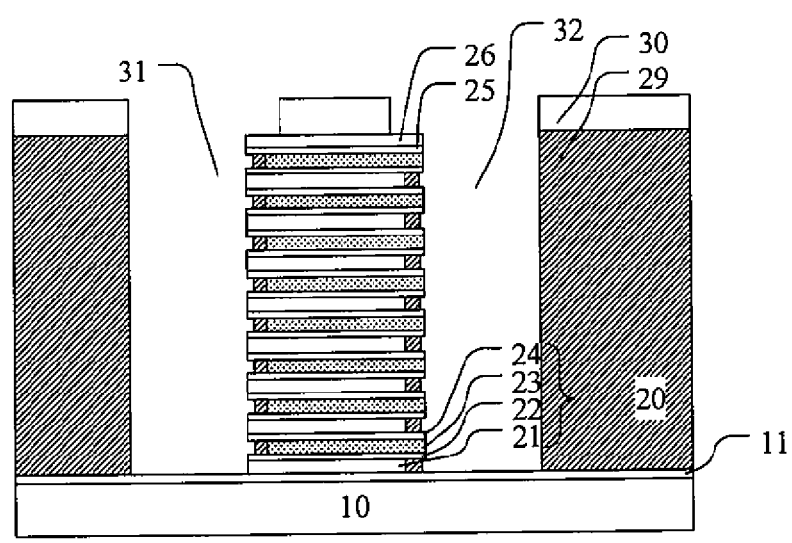
Figure 7:
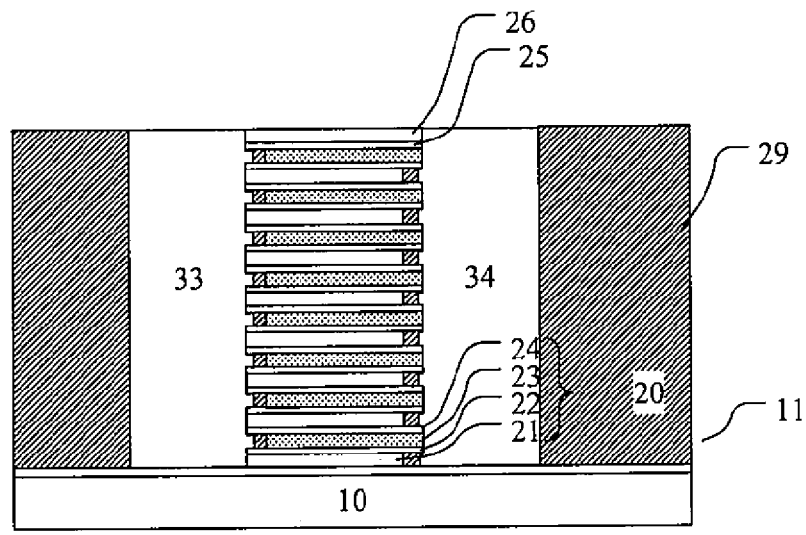
Figure 8:
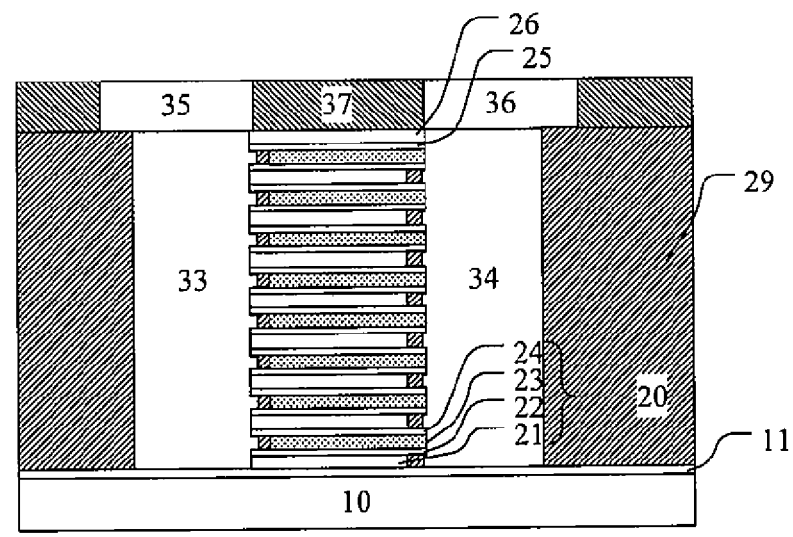

The steps shown in FIGS. 6-8 are performed in this order in the MOL at various stages of manufacturing the capacitor structure.

Referring to FIG. 6, during the step of forming contact holes, two capacitor openings 31, 32 are also formed in the SiN capping layer 29 so as to expose the first side and the second side of the multi-layer structure, which will be used for forming the first electrode and the second electrode of the capacitor structure in the following steps. Since the capacitor openings are formed simultaneously with the contact holes with the same photoresist mask 30, no additional masking and etching steps are required.

The etching process used for forming the contact holes and the capacitor openings is typically anisotropic, such as a reactive ion etching (RIE) process. As mentioned above, the SiN capping layer 29 fills the recesses at the first side and the second side of the multi-layer structure. Thus, at the step of forming the capacitor openings, the portions of the SiN capping layer in the recesses remain. The portions of the SiN capping layer in the recesses at the first side of the multi-layer structure electrically isolate the second electrode layer 23 from the first electrode to be provided in the capacitor opening 31, and the portions of the SiN capping layer in the recesses at the second side of the multi-layer structure electrically isolate the first electrode layer 21 from the second electrode to be provided in the capacitor opening 32.

Then, the photoresist mask 30 is removed by ashing or dissolution with a solvent.

Then, a conductive material (such as tungsten) is deposited into the capacitor openings 31, 32 by a conventional deposition process, such as PVD, CVD, atomic layer deposition, sputtering, and the like, simultaneously with the step of forming metal contacts, or with the separate and additional steps, as shown in FIG. 7. The conductive material in the capacitor opening 31 contacts all of the first electrode layers 21 of the multi-layer structure, so as to form a first capacitor electrode 33. The conductive material in the capacitor opening 32 contacts all of the second electrode layers 23 of the multi-layer structure, so as to form a second capacitor electrode 34.

Then, an interlayer dielectric 37 is formed on the multi-layer structure, with a first electrode pad 35 and a second electrode pad 36 of the capacitor structure formed in the interlayer dielectric 37. Thus, the capacitor structure is finished.

In the resultant capacitor structure, each pair of the adjacent first electrode layer 21 and second electrode layer 23 constitute capacitor plates of a sub-capacitor, and one of the first dielectric layer 22 and the second dielectric layer 24 that is sandwiched between the pair of the adjacent first electrode layer 21 and second electrode layer 23 constitutes a dielectric layer of the sub-capacitor. In other words, the multi-layer structure comprises a stack of the first sub-capacitor comprising the first electrode layer 21, the first dielectric layer 22 and the second electrode layer 23 from the bottom to the top, and the second sub-capacitor comprising the second electrode layer 23, the second dielectric layer 24, and the first electrode layer 21 from the bottom to the top, stacked in an alternate manner. The first capacitor electrode 33 and the second capacitor electrode 34 connect all of the first sub-capacitors and the second sub-capacitors in parallel.

Then, the remaining steps of the manufacturing process continue in the BEOL.

While the invention has been described with reference to specific embodiments, the description is illustrative of the invention. The description is not to be considered as limiting the invention. Various modifications and applications may occur for those skilled in the art without departing from the true spirit and scope of the invention as defined by the appended claims.

What is claimed is:

1. A capacitor structure, comprising,
a plurality of sub-capacitors stacked on a substrate, each of which comprises a top capacitor plate, a bottom capacitor plate and a dielectric layer sandwiched therebetween; and
a first capacitor electrode and a second capacitor electrode connecting the plurality of sub-capacitors in parallel,
wherein the plurality of sub-capacitors include a plurality of first sub-capacitors and a plurality of second sub-capacitors stacked in an alternate manner, so that each of the first sub-capacitors has a bottom capacitor plate overlapping with a top capacitor plate of an underlying second sub-capacitor, with the overlapping plate being a first electrode layer; and each of the second sub-capacitors has a bottom capacitor plate overlapping with a top capacitor plate of an underlying first sub-capacitor, with the overlapping plate being a second electrode layer,
characterized in:
that the first electrode layer and the second electrode layer are made of different conductive materials;
the second electrode layer is etched from a first side of the capacitor structure to form a first recess;
the first electrode layer is etched from a second side of the capacitor structure to form a second recess; and the first and second recesses are filled with a dielectric material to insulate the second electrode layer from the first capacitor electrode and the first electrode layer from the second capacitor electrode, respectively.

2. The capacitor structure according to claim 1, wherein the different conductive materials have different etching rate.

3. The capacitor structure according to claim 2, wherein each of the first electrode layer and the second conductive layer is the one selected from the group consisting of a metal layer, a doped polysilicon layer and any stack thereof.

4. The capacitor structure according to claim 3, wherein the metal layer is made of one selected from a group consisting of TaC, TiN, TaTbN, TaErN, TaYbN, TaSiN, HfSiN, MoSiN, RuTa$_x$, NiTa$_x$, MoN$_x$, TiSiN, TiCN, TaAlC, TiAlN, TaN, PtSi$_x$, Ni$_3$Si, Pt, Ru, Ir, Mo, HfRu, RuO$_x$, and any of their combinations.

5. The capacitor structure according to claim 4, wherein the first electrode layer is a polysilicon layer, and the second electrode layer is a TiN layer.

6. The capacitor structure according to claim 1, wherein the first sub-capacitors and the second sub-capacitors comprise the same dielectric material.

7. The capacitor structure according to claim 1, wherein the first sub-capacitors and the second sub-capacitors comprise different dielectric materials.

8. The capacitor structure according to claim 1, wherein
the first capacitor electrode contacts all of the first electrode layers at the first side, while being electrically isolated from all of the second electrode layers; and
the second capacitor electrode contacts all of the second electrode layers at the second side opposite to the first side, while being electrically isolated from all of the first electrode layer.

9. The capacitor structure according to claim 1, wherein the capacitor structure is formed in a shallow trench isolation region.

* * * * *

UNITED STATES PATENT AND TRADEMARK OFFICE
CERTIFICATE OF CORRECTION

Page 1 of 1

PATENT NO. : 8,610,248 B2
APPLICATION NO. : 12/993048
DATED : December 17, 2013
INVENTOR(S) : Liang et al.

It is certified that error appears in the above-identified patent and that said Letters Patent is hereby corrected as shown below:

On the title page, in column 1, under "(30) Foreign Application Priority Data", line 1, delete "2010 1 0111332" and insert --2010 1 0111332.9--, therefor On the title page, in column 2, under "Other Publications", line 1, after "Application", delete "and", therefor On the title page, in column 2, under "(57) Abstract", line 13, delete "layer;" and insert --layer,--, therefor In the Claims Column 6, line 57, in Claim 1, delete "layer;" and insert --layer,--, therefor Signed and Sealed this
Sixteenth Day of December, 2014

Michelle K. Lee
*Deputy Director of the United States Patent and Trademark Office*

UNITED STATES PATENT AND TRADEMARK OFFICE
CERTIFICATE OF CORRECTION

PATENT NO.       : 8,610,248 B2  
APPLICATION NO.  : 12/993048  
DATED            : December 17, 2013  
INVENTOR(S)      : Liang et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 377 days.

Signed and Sealed this
Twenty-second Day of September, 2015

Michelle K. Lee
*Director of the United States Patent and Trademark Office*